United States Patent
Sakumura et al.

(10) Patent No.: US 11,049,897 B2
(45) Date of Patent: Jun. 29, 2021

(54) DETECTOR

(71) Applicant: RIGAKU CORPORATION, Tokyo (JP)

(72) Inventors: Takuto Sakumura, Tokyo (JP); Yasukazu Nakaye, Tokyo (JP); Kazuyuki Matsushita, Tokyo (JP); Satoshi Mikusu, Tokyo (JP)

(73) Assignee: RIGAKU CORPORATION, Tokyo (JP)

( * ) Notice: Subject to any disclaimer, the term of this patent is extended or adjusted under 35 U.S.C. 154(b) by 0 days.

(21) Appl. No.: 16/341,964

(22) PCT Filed: Jul. 5, 2017

(86) PCT No.: PCT/JP2017/024611
§ 371 (c)(1),
(2) Date: Apr. 15, 2019

(87) PCT Pub. No.: WO2018/078956
PCT Pub. Date: May 3, 2018

(65) Prior Publication Data
US 2019/0245000 A1    Aug. 8, 2019

(30) Foreign Application Priority Data

Oct. 27, 2016 (JP) .............................. JP2016-210863

(51) Int. Cl.
*H01L 27/146* (2006.01)
*G01T 7/00* (2006.01)
(Continued)

(52) U.S. Cl.
CPC .......... *H01L 27/14643* (2013.01); *G01T 7/00* (2013.01); *G01T 7/005* (2013.01);
(Continued)

(58) Field of Classification Search
CPC ......... G01T 7/00; G01T 7/005; H01L 27/144; H01L 27/146; H01L 27/14605; H01L 27/14643; H04N 5/32
See application file for complete search history.

(56) References Cited

U.S. PATENT DOCUMENTS 7,189,971 B2   3/2007   Spartiotis et al.
7,339,246 B2   3/2008   Nascetti et al.
(Continued)

FOREIGN PATENT DOCUMENTS

CN      1636278 A       7/2005
CN    102544032 A2      7/2012
(Continued)

OTHER PUBLICATIONS

International Search Report of PCT/JP2017/024611 dated Nov. 7, 2017.
(Continued)

*Primary Examiner* — Mark R Gaworecki
(74) *Attorney, Agent, or Firm* — Birch, Stewart, Kolasch & Birch, LLP (57) ABSTRACT

A detector capable of securing space for arranging pixels in the vicinity of edges of adjacent readout chips according to design of counting circuits. A 2-dimensional hybrid pixel array detector configured to detect radiation rays, including a detection unit configured to detect the radiation rays incident in a region of each pixel 115, and a plurality of the readout chips including counting circuits 121 respectively connected to each of the pixels 115, the counting circuits 121 having a smaller set pitch than the pixels 115 along a certain direction in a detection surface. The regions occupied by the pixels and counting circuits corresponding to the pixels overlapping at least partially, and the connection being made in the overlapping regions.

6 Claims, 11 Drawing Sheets

(51) Int. Cl.
*H04N 5/32* (2006.01)
*H01L 27/144* (2006.01)

(52) U.S. Cl.
CPC .......... *H01L 27/144* (2013.01); *H01L 27/146* (2013.01); *H01L 27/14605* (2013.01); *H04N 5/32* (2013.01)

(56) References Cited

U.S. PATENT DOCUMENTS

| | | | |
|---|---|---|---|
| 7,361,881 | B2 | 4/2008 | Spartiotis |
| 8,482,108 | B2 | 7/2013 | Park et al. |
| 9,054,010 | B2 | 6/2015 | Kim et al. |
| 9,476,991 | B2 | 10/2016 | Vora |
| 9,915,741 | B2 | 3/2018 | Cao et al. |
| 9,966,409 | B2 | 5/2018 | Danzer et al. |
| 10,061,040 | B2 | 8/2018 | Cao et al. |
| 10,228,473 | B2 | 3/2019 | Cao et al. |
| 10,712,456 | B2 | 7/2020 | Cao et al. |
| 2003/0155516 | A1 | 8/2003 | Spartiotis et al. |
| 2003/0173522 | A1 | 9/2003 | Spartiotis |
| 2004/0195640 | A1 | 10/2004 | Nascetti et al. |
| 2012/0146016 | A1 | 6/2012 | Park et al. |
| 2012/0223241 | A1 | 9/2012 | Kim et al. |
| 2016/0015339 | A1 | 1/2016 | Danzer et al. |
| 2016/0097864 | A1 | 4/2016 | Vora |
| 2018/0017987 | A1 | 1/2018 | Crandall-Seibert et al. |
| 2018/0180749 | A1 | 6/2018 | Cao et al. |
| 2018/0348383 | A1 | 12/2018 | Cao et al. |
| 2019/0170885 | A1 | 6/2019 | Cao et al. |

FOREIGN PATENT DOCUMENTS

| | | |
|---|---|---|
| CN | 102655159 A | 9/2012 |
| CN | 105280659 A | 1/2016 |
| CN | 109891589 A | 6/2019 |
| DE | 101 42 531 A1 | 3/2003 |
| DE | 10 2014 213 734 A1 | 2/2016 |
| EP | 2 463 908 A2 | 6/2012 |
| EP | 3 534 403 A1 | 9/2019 |
| JP | 2002-198509 A | 7/2002 |
| JP | 2005-501417 A | 1/2005 |
| JP | 2012-185159 A | 9/2012 |
| KR | 10-2012-0065047 A | 6/2012 |
| KR | 10-2012-0100627 A | 9/2012 |
| WO | 9945411 A1 † | 9/1999 |
| WO | WO 99/45411 A1 | 9/1999 |
| WO | 2003019659 A2 † | 3/2003 |
| WO | WO 2003/019659 A2 | 3/2003 |
| WO | WO 20151151543 A1 | 10/2016 |

OTHER PUBLICATIONS

Bosma, Marten Jan, "On the Cutting Edge of Semiconductor Sensors", Towards Intelligent X-ray Detectors, Institute for High Energy Physics, Dec. 21, 2012 (Dec. 21, 2012), 184 pages.

Kraft, P., et al., "Performance of single-photon-counting PILATUS detector modules" Journal of Synchrotron Rad, (2009) 16, ISSN 0909-0495, Mar. 17, 2009 (Mar. 17, 2009), pp. 368-375.

Kraft, P., et al., "Characterization and Calibration of Pilatus Detectors", IEEE Transactions on Nuclear Science, vol. 56, No. 3. Downloaded Jun. 25, 2009, pp. 758-764.

Extended European Search Report dated Apr. 21, 2020, for European Application No. 17865346.5.

Japanese Office Action, dated Dec. 22. 2020, for Japanese Application No. 2018-547117, with an English machine translation.

Bosma, Marten Jan, "On the Cutting Edge of Semiconductor Sensors, Towards Intelligent X-ray Detectors," Institute for High Energy Physics, Dec. 21, 2012†

Kraft, P. et al., "Characterization and Calibration of PILATUS Detectors," IEEE Transactions on Nuclear Science, vol. 56, No. 3, Jun. 25, 2009, pp. 758-764.†

† cited by third party

(PRIOR ART)

FIG. 10

DETECTOR

CROSS-REFERENCE TO RELATED APPLICATIONS

This application is a 35 U.S.C. § 371 national phase of PCT International Application No. PCT/JP2017/024611, filed Jul. 5, 2017, which claims the benefit of priority under 35 U.S.C. § 119 to Japanese Patent Application No. 2016-210863, filed Oct. 27, 2016, the contents of which are incorporated herein by reference in their entirety.

FIELD OF THE INVENTION

The present invention relates to a 2-dimensional hybrid pixel array detector configured to detect radiation rays.

BACKGROUND

A photon-counting 2-dimensional hybrid pixel array detector has a plurality of pixels arranged on a detection surface, and a readout chip arranged on the backside thereof to read a count value detected by a pixel. The readout chip is smaller than the detection surface and therefore it is common to tile a plurality of the readout chips on the backside of the detection surface.

Figure 8:
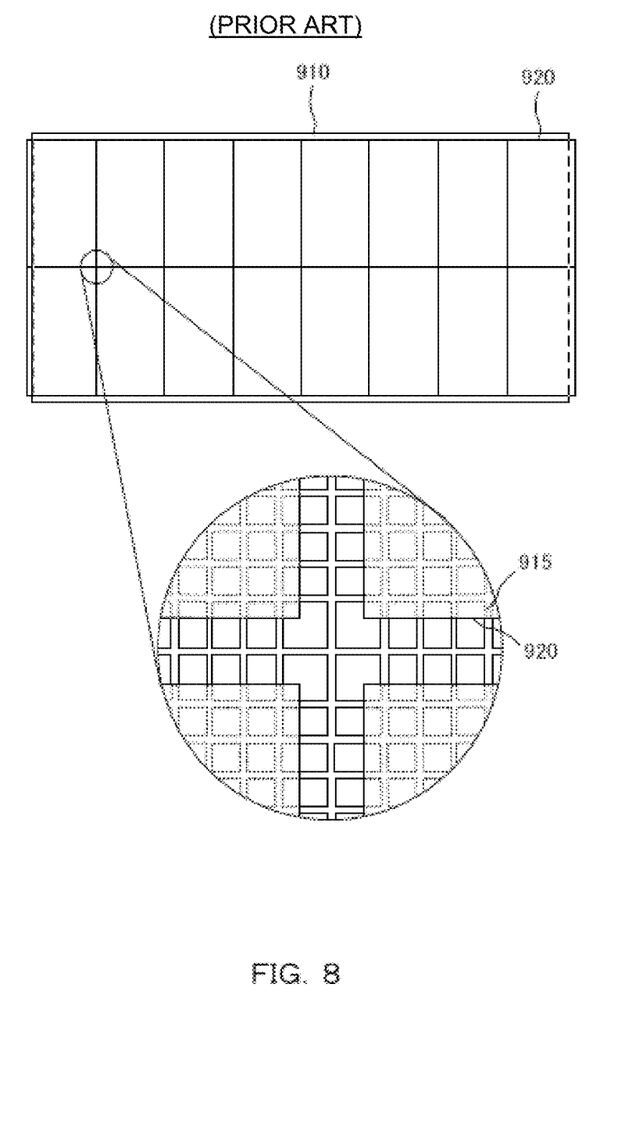
FIG. 8 is a rear view illustrating a conventional detection unit and readout chips.

For tiling a plurality of the readout chips, it is necessary to provide a gap between the respective readout chips. Conventionally, for the inter-chip gap, a pixel is formed to apply to the gap, unlike pixels at other positions. FIG. 8 is a rear view illustrating a conventional detection unit 910 and readout chips 920. Although the detection unit 910 has uniformly shaped pixels 915 arranged regularly in principle, the shape or position of the pixels 915 are irregular in the vicinity of intervals between the edges of the readout chips 920, and large-sized pixels of the pixels 915 are provided.

Figure 9:
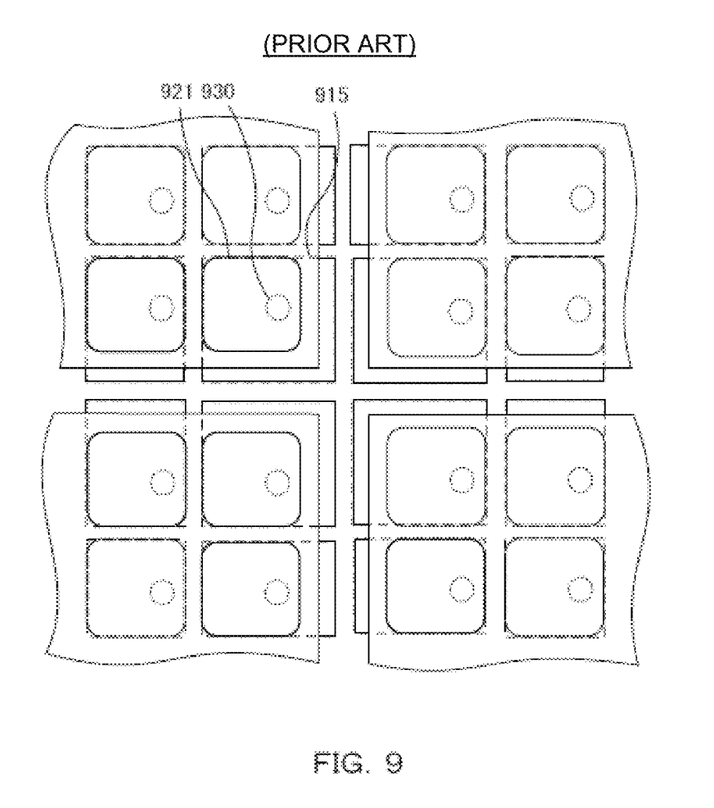
FIG. 9 is a rear view illustrating correspondence relation between conventional pixels and counting circuits.
Figure 10:
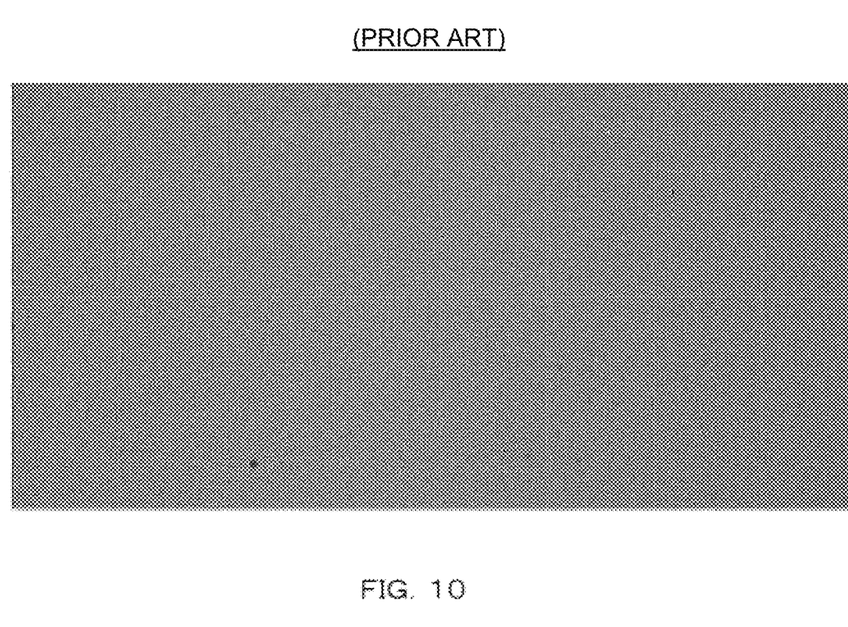
FIG. 10 illustrates a conventional detected data image.

FIG. 9 is a rear view illustrating an arrangement of conventional pixels 915 and counting circuits 921. The pixels 915 and the counting circuits 921 are arranged with a same set pitch, and the entire region of the counting circuits 921 assigned for the pixels 915 overlaps with the pixels 915. Larger pixels of the pixels 915 are arranged in the vicinity of intervals between the edges of the readout chips 920, therefore position information of detection signals can be lost and counting loss by the counting circuits can arise. FIG. 10 illustrates a conventional detected data image. As illustrated in FIG. 10, the detected data image has the intervals between the edges of the readout chips displayed with different brightness from other regions. Accordingly, the detection condition in the vicinity of intervals between the edges of the readout chips turns out to be different from the conditions for other regions, whereby correction of raw count values becomes necessary.

For correction, there is known a method of converting the count values into count values of virtual pixels arranged regularly with no gap existing therebetween. On this occasion, the count values are corrected with a proportion according to the pixel area ratios. (See, for example, non-patent literature, P. Kraft, A. Bergamaschi, Ch. Broennimann, R. Dinapoli, E. F. Eikenberry, B. Henrich, I. Johnson, A. Mozzanica, C. M. Schleputz, P. R. Willmott and B. Schmitt, "Performance of single-photon-counting PILATUS detector modules", Journal of Synchrotron Radiation, (2009). 16, 368-375 and Marten Jan Bosma, "On the Cutting Edge of Semiconductor Sensors", Institute for High Energy Physics, 21-12-2012.

SUMMARY AND INTRODUCTORY DESCRIPTION OF EMBODIMENTS OF THE INVENTION

However, even when the aforementioned correction is applied to a pixel at a position overlapping with the edges of adjacent readout chips, if the pixel has a larger area than pixels at other positions causes loss of position information when correcting the intensity of radiation rays detected on the pixel. In addition, a large-sized pixel causes counting loss when responsiveness of the circuits is insufficient. In addition, narrowness of the tiling interval between the readout chips causes contact of edges during mounting, thereby increasing the defect occurrence rate.

It is an object of the present invention, which has been made in view of the aforementioned circumstances, to provide a detector capable of securing sufficient connection in the vicinity of edges of the adjacent readout chips according to design of counting circuits, without requiring uniquely shaped pixels.

In order to achieve the aforementioned object, a detector of the present invention, which is a 2-dimensional hybrid pixel array detector configured to detect radiation rays, includes a detection unit configured to detect the radiation rays incident in a region of each pixel, and a plurality of readout chips including counting circuits respectively connected to each of pixels, wherein the counting circuits have a smaller set pitch than the pixels along a certain direction in a detection surface, the regions occupied by the pixels and counting circuits corresponding to the pixels overlap at least partially, and the connection is made in the overlapping regions.

As thus described, the set pitch of the counting circuits is smaller than the set pitch of the pixels along a certain direction in the detection surface, and therefore it is possible to secure sufficient connection in the vicinity of the edges of the adjacent readout chips, without requiring specially shaped pixels. As a result, it is possible to design the shape and arrangement of the pixels regardless of the edges of the readout chips, and arrange In addition, it is possible to obtain correct position information which has conventionally been lost in the vicinity of the edges of the adjacent readout chips, and correction of data becomes unnecessary. Although counting loss can occur due to insufficient responsiveness of the circuits in the case where large-sized pixel are arranged at a position between the readout chips, pixel size can be reduced so as to prevent counting loss. The distance between the edges of the adjacent readout chips can be made larger and therefore mounting becomes easier.

Further, in the detector of the present invention, a connection position of the pixel and a counting circuit closest to the edge of an accompanying readout chip facing the edge of the readout chip adjacent thereto, among the plurality of the readout chips, exists within the region near the edge. Accordingly, it is possible to connect the counting circuits and the pixels, while making the set pitch of counting circuits smaller than the set pitch of the pixels. It is then possible to secure a space for pixel arrangement in the vicinity of the edges of the adjacent readout chips, and arrange the pixels having the same shape as the pixels in other regions.

Further, in the detector of the present invention, connection positions of the pixels and the counting circuits of the readout chips are distributed in a linearly symmetric or point symmetric manner. Accordingly, connection between a pixel and a counting circuit corresponding to the pixel becomes easy, and detectors can be produced with connections according to a certain standard.

Further, in the detector of the present invention, the shape of the pixels is rectangular. Accordingly, it becomes easy to adjust the pixel size, design the arrangement of connecting parts, and manufacture the detector satisfying the foregoing conditions.

Further, in the detector of the present invention, the distance between the edges of adjacent ones of the readout chips is 30 µm or more. Accordingly, the precision required when arranging the readout chips adjacent to each other can be relaxed, and failure due to contact of edges can be prevented.

Further, in the detector of the present invention, connection from the counting circuit to a terminal has a via structure. Accordingly, no lead wire is required at the end of detection module having a plurality of the readout chips provided therein, which allows for a configuration with the space between the detection modules being narrowed. As a result, it is possible to form a detector capable of detecting a wide range by connecting the detection modules.

According to the present invention, it is possible to secure sufficient connection in the vicinity of the edges of adjacent readout chips according to design of counting circuits, without requiring uniquely shaped pixels.

DETAILED DESCRIPTION OF EMBODIMENTS OF THE INVENTION

Next, embodiments of the present invention will be described, referring to the accompanying drawings. In order to facilitate understanding of explanation, same components are provided with same reference numerals in respective drawings, with duplicate explanation thereof being omitted.

Figure 1:
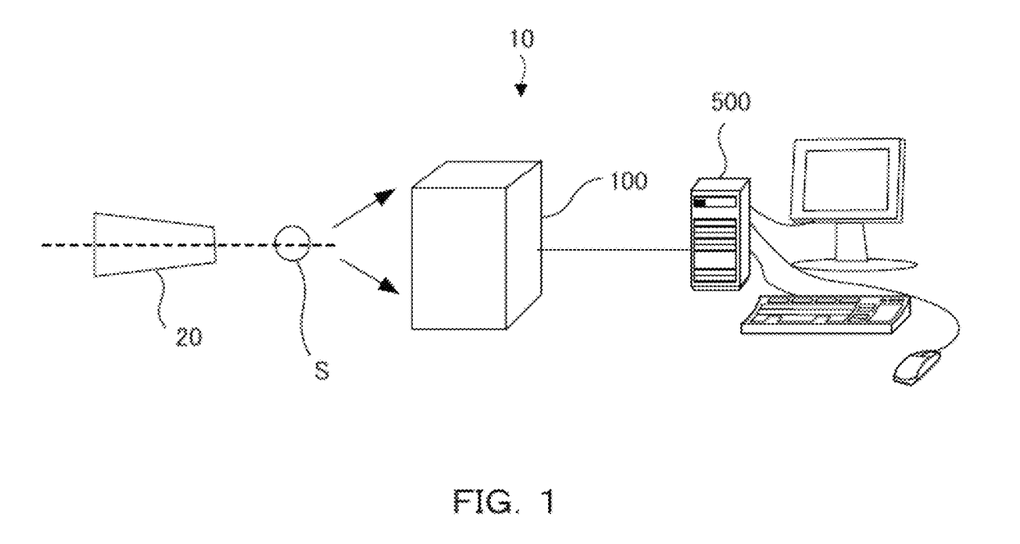
FIG. 1 is a schematic view illustrating an exemplary configuration of a detection system of a first embodiment.

FIG. 1 is a schematic view illustrating an exemplary configuration of a detection system 10. The detection system 10 includes a radiation ray source 20, a sample S, a detector 100, and a data processing apparatus 500 as illustrated in FIG. 1.

The radiation ray source 20, which is an X-ray source, for example, causes an electron flux emitted from a filament as a cathode to collide with a rotor target as an anticathode to generate X-rays. The X-rays emitted from the radiation ray source 20 are so-called point focus X-ray beams. Note that the radiation ray source 20 can be as further examples a source of α-rays, β-rays, γ-rays, or neutron rays.

The outer peripheral surface of the rotor target has provided thereon a metal member made of Mo or Cu, for example. When electrons collide with a Mo target, X-rays including MoKα-rays are emitted, which are the characteristic rays (wavelength 0.711 Å). When electrons collide with a Cu target, X-rays including CuKα-rays, are emitted, which are the characteristic X-rays (wavelength 1.542 Å).

The sample S is supported by a sample supporting device. The detector 100 detects diffracted rays diffracted by the sample S or radiation rays such as fluorescence X-rays, for example. The data processing apparatus 500 processes the detected count value and outputs the detection result. Details of the detector 100 and data processing apparatus 500 are described below.

Figure 2:
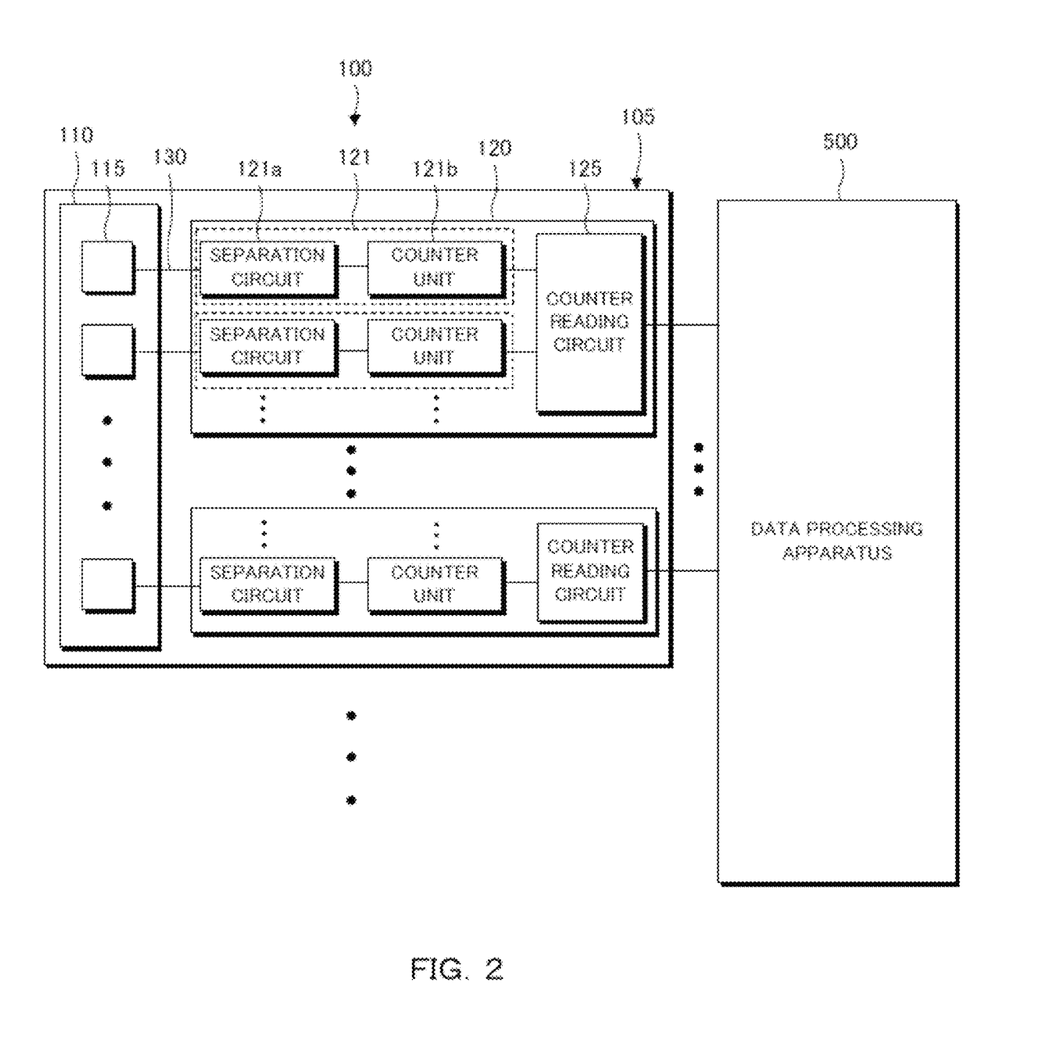
FIG. 2 is a block diagram illustrating the functional configuration of a detector and a data processing apparatus of the first embodiment.

FIG. 2 is a block diagram illustrating a functional configuration of the detector 100 and data processing apparatus 500. The detector 100 is, for example, a photon-counting hybrid pixel array 2-dimensional semiconductor detector configured to detect X-rays. However, the detector 100 is not limited to a 2-dimensional semiconductor detector and can be a 1-dimensional semiconductor detector. Although the detector 100 can include a single detection module 105, it is preferred to include the plurality of detection modules 105. The detection module 105 includes a detection unit 110 and readout chips 120.

The detection unit 110, having a plurality of pixels 115 for receiving radiation rays, detects the radiation rays incident in the region of each of the pixels 115. The detection unit 110 has a detection surface formed thereon by the plurality of the pixels 115, with the readout chips 120 being tiled all over the detection surface. The readout chips 120 have provided therein counting circuits 121 respectively assigned to each of the pixels 115. The shape of the pixels 115 can be identical all over the detection surface according to the arrangement of the counting circuits 121 described below.

Although the shape of the pixels 115 can be polygonal such as triangular, hexagonal, or the like, it is preferred to be rectangular. Accordingly, it becomes easy to adjust the pixel size, design the arrangement of connecting parts, and manufacture the detector satisfying the foregoing conditions. In addition, the rectangle is preferred to be a square.

Each of the readout chips 120 has a plurality of counting circuits 121 and a counter readout circuit 125. The counting circuits 121 are respectively assigned to each of the pixels 115, with each pair of the pixels 115 and the counting circuits 121 assigned thereto being electrically connected to each other via a connecting part 130.

Each of the counting circuits 121 includes a separation circuit 121a and a counter unit 121b. The separation circuits 121a are respectively connected to each of the plurality of the pixels 115, and the counter units 121b are respectively connected to each of the separation circuits 121a. Each of the counter readout circuits 125 is connected to a plurality of the counter units 121b.

The separation circuit 121a separates and outputs pulsed signals of the pixel 115 for each radiation ray wavelength. The counter unit 121b counts the number of each of the signals separated for each wavelength by the separation circuit 121a. For example, the counter unit 121b has built therein a same number of counter circuits as the number of separations, thereby enabling counting of the number of each of the pulsed signals separated by the separation circuit 121a. The counter readout circuit 125 reads data counted by each of the counter units 121b for each of the readout chips 120. The output signal of the counter readout circuit 125, which is radiation ray detection data separated by an energy threshold value, is transmitted to the data processing apparatus 500 via a communication line.

The data processing apparatus 500 is a personal computer, for example. The personal computer includes, for example, a CPU for controlling arithmetic operation, a memory for storing data, system software stored in a predetermined region in the memory, and application program software stored in other predetermined regions in the memory.

The data processing apparatus 500 has a keyboard or the like connected thereto as an input unit for receiving user input. In addition, the data processing apparatus 500 has an output unit connected thereto such as a display, a printer, or the like. The output unit outputs measurement results according to instructions from the data processing apparatus 500.

Figure 3A:
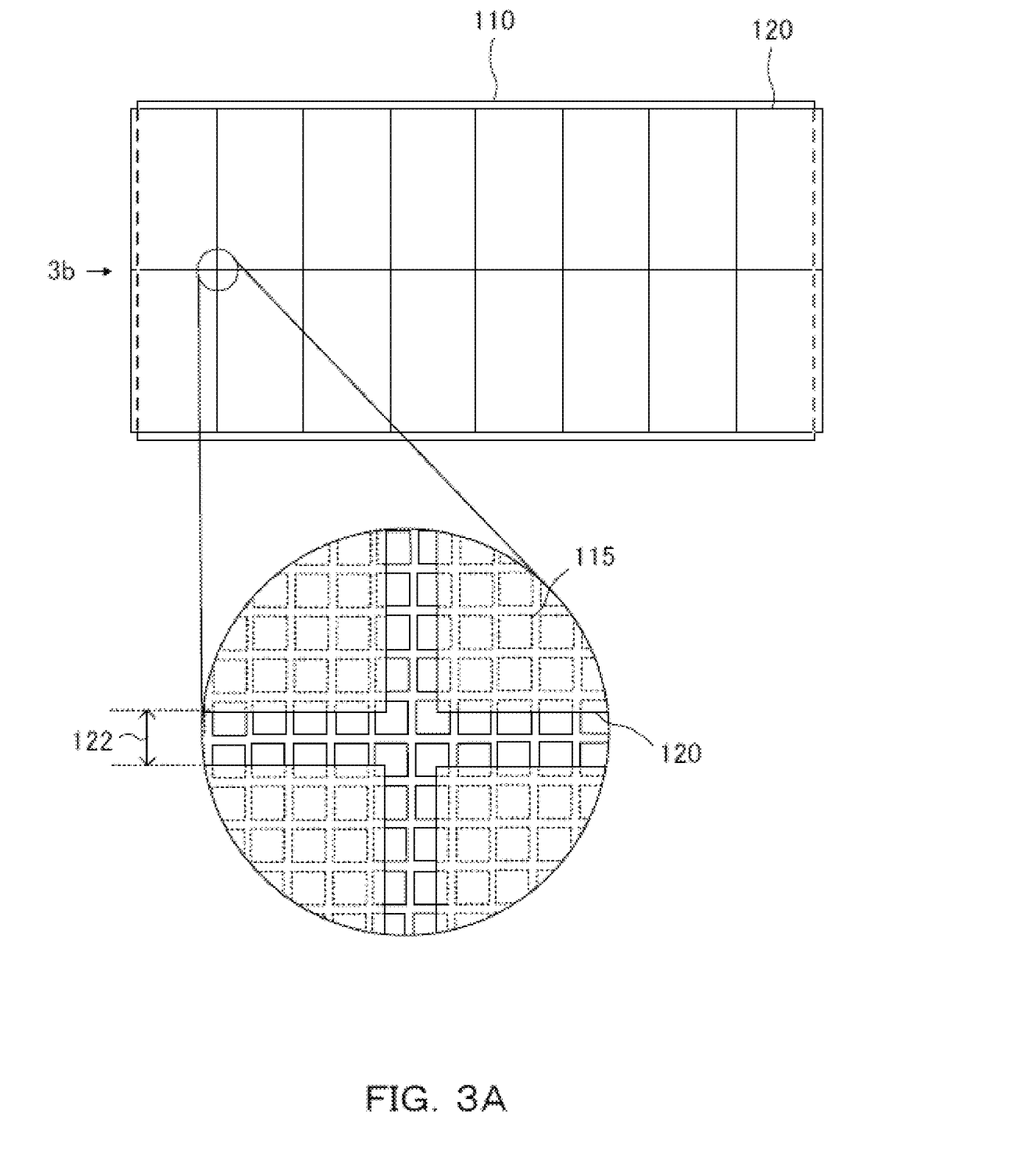
FIG. 3 is a rear view (a) and a side cross-sectional view (b) illustrating a detection unit and a readout chip of the first embodiment.

FIG. 3(a) is a rear view illustrating the detection unit and the readout chip. As illustrated in FIG. 3(a), the plurality of pixels 115 of the detection unit 110 are organized as a 2-dimensional array, and arranged generally regularly in a uniform shape. However, some of the pixels 115 can have an irregular shape or position. In the example illustrated in FIG. 3(a), the rectangular plate-shaped readout chips 120 are tiled over the detection unit 110, with a slight gap 122 being provided between the edges of adjacent ones of the readout chips 120.

Note that FIG. 3(a) is illustrated in a simplified manner with the counting circuits 121 and the connecting parts 130 omitted. In addition, the detection module 105 is seen from the back side (reverse side of the photoreceptor plane), and therefore the pixels 115 hidden behind the readout chip 120 is represented by dotted lines in the enlarged view.

Figure 3B:
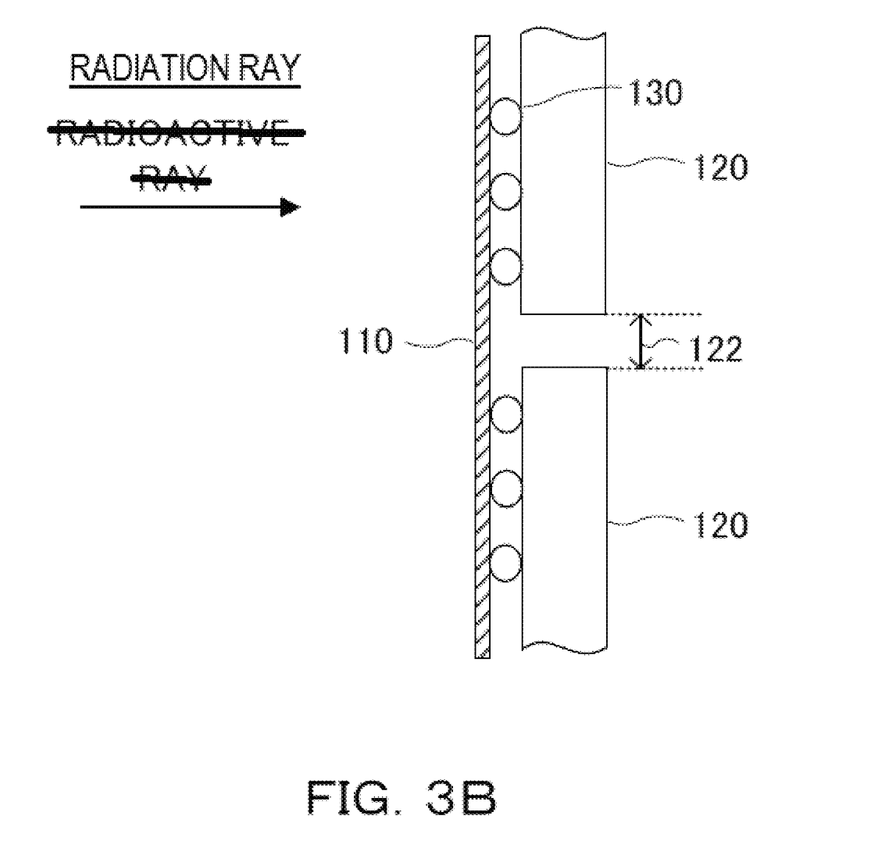

FIG. 3(b) is a side cross-sectional view illustrating the detection unit 110 and the readout chip 120 seen from a certain direction 3b in FIG. 3(a). As illustrated in FIG. 3(b), the detection unit 110 and the readout chip 120 are connected by the connecting part 130 using bump bonding, for example.

The width of the gap 122 between the edges of adjacent ones of the readout chips 120 can be sufficiently large and is preferably 30 μm or more. Accordingly, the precision required when arranging adjacent ones of the readout chips 120 is relaxed, and it is possible to prevent trouble due to contact of edges.

Figure 4:
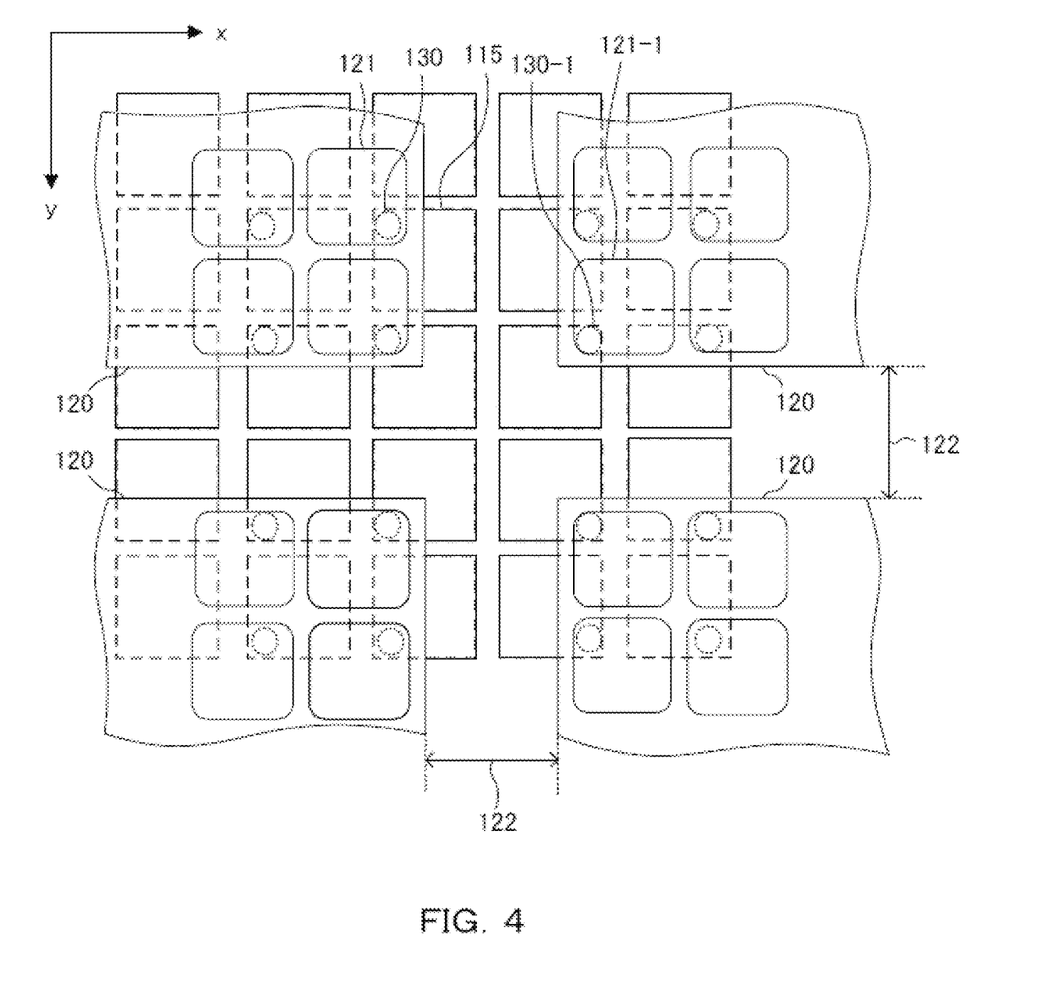
FIG. 4 is a rear view illustrating an exemplary arrangement of pixels and counting circuits in the first embodiment.

FIG. 4 is a rear view illustrating an exemplary arrangement of the pixels 115 and the counting circuits 121. As illustrated in FIG. 4, the counting circuits 121 in the readout chip 120 is arranged for each of the pixels 115, with each pair of the pixels 115 and the counting circuits 121 connected by the connecting parts 130. Signals when radiation rays are detected on the pixels 115 enter, and are counted by, the counting circuits 121 respectively assigned and connected via the connecting parts 130.

The counting circuits 121 are smaller than the pixels 115 in size (lengths in x- and y-directions). Note that, although the pixels are represented as sharp-cornered squares and the counting circuits are represented as round-cornered squares in the drawing for ease of understanding, actually they are not limited to such shapes (the same goes for the following description).

It is preferred that the position of the connecting part 130 of the pixel 115 and the counting circuit 121 which is closest to an edge facing the edge of an adjacent one of the readout chips 120 lies within a region at the edge side, in the region occupied by the counting circuits 121. For example, in the counting circuit 121-1, the connecting part 130-1 lies within a quarter region near the corner of the readout chip 120.

The aforementioned arrangement allows for connecting the counting circuits 121 and the pixels while making the set pitch of the counting circuits 121 smaller than the set pitch of the pixels 115. Accordingly, it is possible to secure sufficient connection even for a small pixel in the vicinity of the edge of an adjacent one of the readout chips 120, and arrange the pixels 115 of the same shape as the pixels 115 in other regions. Here, it is effective that the connecting parts 130 of the counting circuits 121 of the four corners in the readout chip 120 exist within the region at the edge side.

Additionally, in the example illustrated in FIG. 4, the set pitch of the counting circuits 121 is smaller than the set pitch of the pixels 115 along the x- and y-directions on the detection surface. In other words, the arrangement interval between the centers of the counting circuits is smaller than the arrangement interval between the centers of the pixels 115. In average, the set pitch of the counting circuits 121 is inevitably smaller than the set pitch of the pixels 115, and further it is preferred that set pitch of the counting circuits 121 is smaller than the set pitch of the pixels 115 for all the arrangements.

Thus, a part of the region occupied by the pixel 115 and a part of the region occupied by the counting circuit 121 corresponding to the pixel 115 overlap with each other in the thickness direction. The pixel 115 and the counting circuit 121 are connected by the connecting part 130 provided within the overlapping region. It is preferred that the connecting part 130 is formed by bump bonding using a wireless micro spherical solder bump, in which case the pixel 115 and the counting circuit 121 can be connected in a compact manner with a short distance.

As a result, it is possible to obtain the correct position information without correction in the vicinity of edge of the readout chip 120. In addition, it is possible to prevent counting loss at the time of counting, and take a large distance between the edges of adjacent ones of the readout chips 120, whereby it becomes easier to avoid contact of the readout chips 120, which leads to easier mounting thereof.

Figure 5:
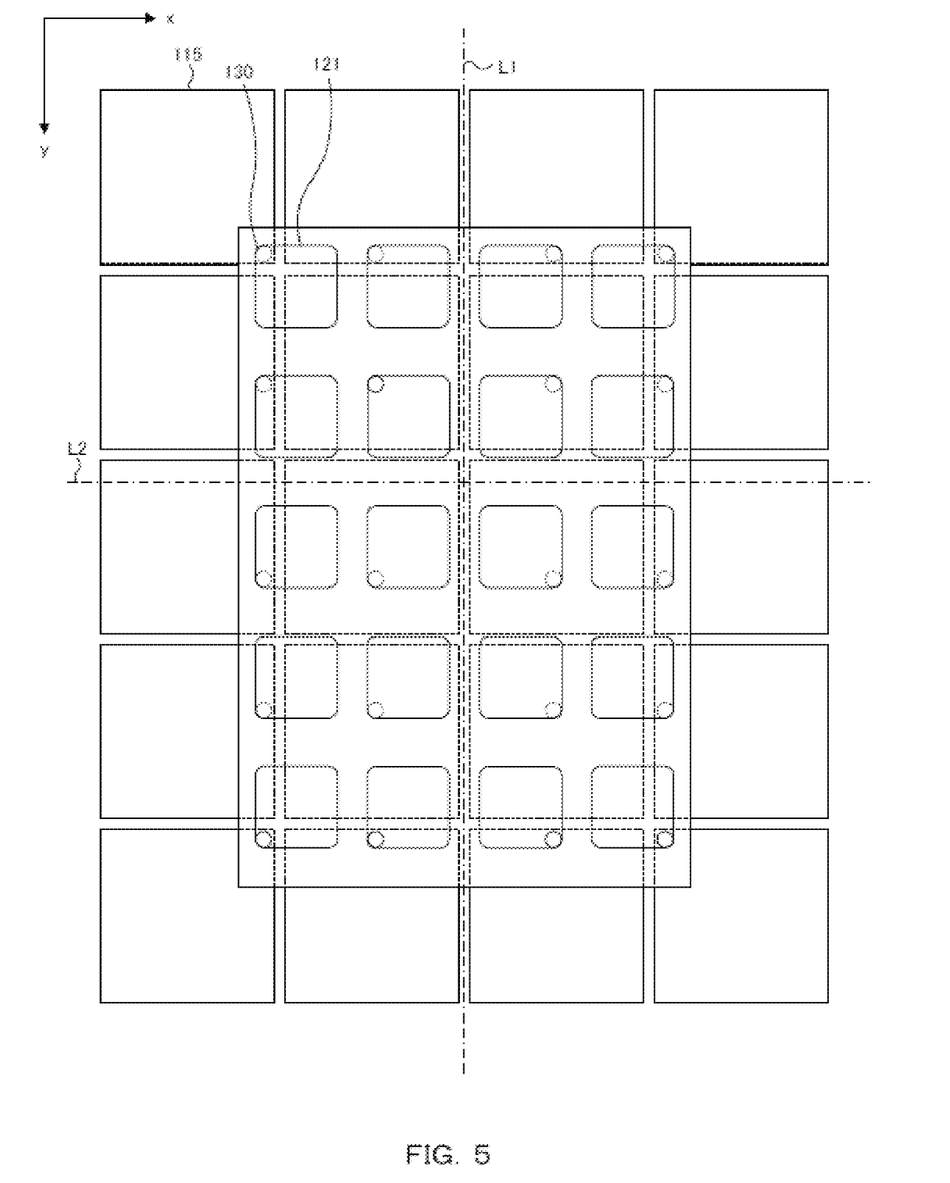
FIG. 5 is a rear view illustrating an exemplary arrangement of counting circuits and connecting parts all over the readout chips in the first embodiment.

FIG. 5 is a rear view illustrating an exemplary arrangement of the counting circuits 121 and the connecting parts 130 all over the readout chip 120. The counting circuits 121 provided within the readout chip 120 has shorter sides than the sides of the pixels 115 in the x- and y-directions, with a smaller set pitch as well. The connecting parts 130 are provided on the overlapping region of the pixels 115 and the counting circuits 121 assigned to the pixels 115.

As a result of the aforementioned arrangement, the positions of the connecting parts 130 of the pixels 115 and the counting circuits 121 in the readout chip 120 are distributed in a manner dispersing outward (the interval expanding) from one point (intersection of a straight line L1 and a straight line L2) in the vicinity of the center of the detection surface. Such an arrangement is preferable, in which case the arrangement of the connecting parts 130 for the counting circuits 121 would be biased toward the edge of the readout chip 120.

The aforementioned arrangement of the connecting parts 130 allows for securing the connection of the counting circuits 121 and the pixels 115 using bump bonding, while making the set pitch of the counting circuits 121 smaller than set pitch of the pixels 115. Note that, presenting the aforementioned examples from a different viewpoint, the plurality of counting circuits 121 are designed to be arranged in a overall center biased manner, in comparison with conventional examples.

Additionally, in the readout chip 120, the positions of the connecting parts 130 of the pixels 115 and the counting circuits 121 are symmetric relative to the straight line L1 perpendicular to the x-direction and the straight line L2 perpendicular to the y-direction. As thus described, it is preferred that the positions of the connecting parts 130 of the pixels 115 and the counting circuits 121 are linearly symmetric or point symmetric. Accordingly, it is possible to manufacture detection modules with connections according to a certain standard.

Figure 6:
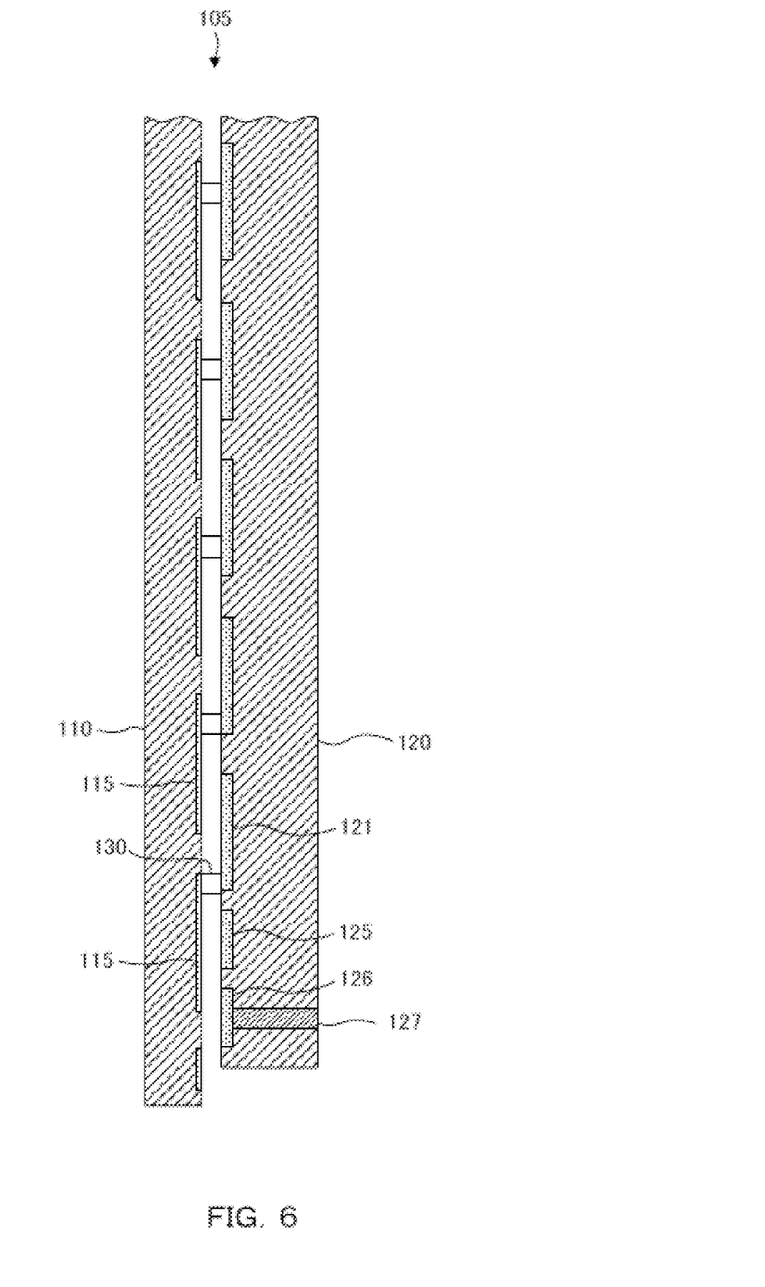
FIG. 6 is a side cross-sectional view illustrating a via structure in a readout chip 120.

FIG. 6 is a side cross-sectional view illustrating a via structure 127 within the readout chip 120. In the example illustrated in FIG. 6, a part of a signal line from the counter readout circuit 125 to a terminal of a communication line leading to the data processing apparatus 500 is connected by a readout pad 126 and the via structure 127. Although the signal line can be taken from the readout pad 126 by wire bonding, using the via structure 127 as illustrated in FIG. 6 makes the connection to the back side of the readout chip 120 less bulky and simple. As thus described, it becomes unnecessary to provide a lead wire by wire bonding to the end of the detection module 105 having the plurality of readout chips 120 provided thereon, which allows for an almost seamless arrangement with a narrowed interval between the detection modules 105. As a result, it is possible to form a detector capable of detecting a wide range by connecting the detection modules 105.

In addition, interval at which the counting circuits 121 are provided is smaller than the interval at which the pixels 115 are provided, as illustrated in FIG. 6, and therefore the pixels 115 are provided outside the outermost periphery of the counting circuits 121 of the readout chip 120. The counter readout circuits 125 and the readout pads 126 can be arranged at a position overlapping with the pixels 115 of interest located outside (outer periphery of the set of the counting circuits 121), and therefore it is possible to accommodate all the readout chips 120 inside the edge of the detection unit 110 when seen from a direction perpendicular to the detection surface.

Figure 7:
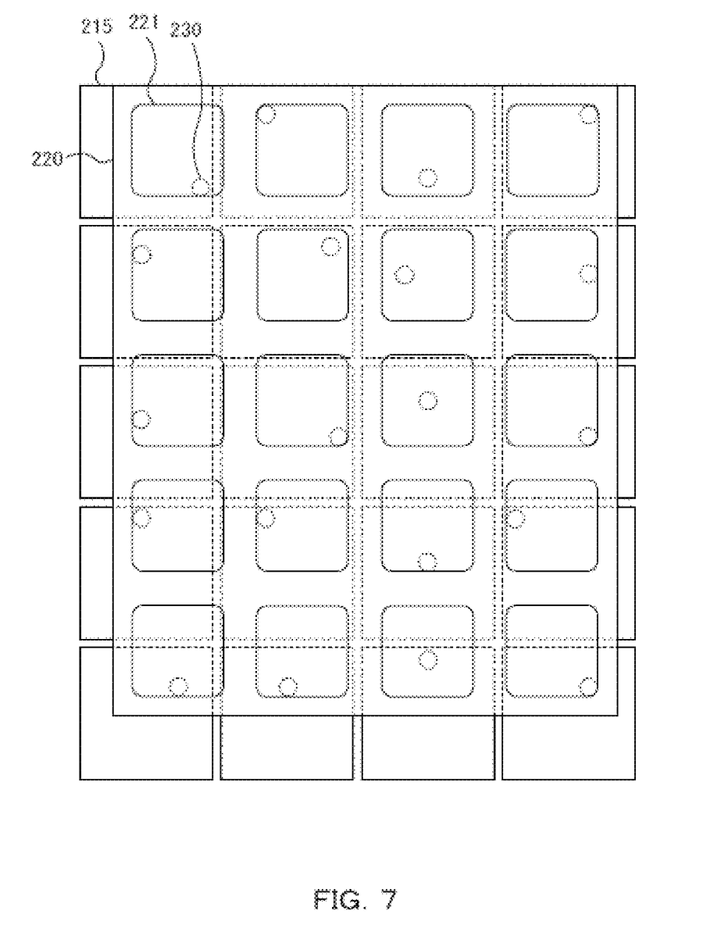
FIG. 7 is a rear view illustrating an exemplary arrangement of counting circuits and connecting parts all over the readout chips in a second embodiment.

Although the connecting parts 130 are provided regularly in the aforementioned embodiment, they need not always be provided regularly. FIG. 7 is a rear view illustrating an exemplary arrangement of counting circuits 221 and connecting parts 230 all over the readout chip 220. When compared with the exemplary arrangement illustrated in FIG. 5, the difference of size between pixels 215 and the counting circuits 221 is small in the exemplary arrangement illustrated in FIG. 7. Accordingly, it is possible to secure sufficiently wide overlapping regions of the pixels 215 and the counting circuits 221, whereby the degree of freedom of the arrangement of the connecting parts 230 becomes large. Therefore, an irregular arrangement of the connecting parts 230 becomes possible as illustrated in FIG. 7.

While the above description constitutes the preferred embodiment of the present invention, it will be appreciated that the invention is susceptible to modification, variation and change without departing from the proper scope and fair meaning of the accompanying claims.

The invention claimed is:

1. A 2-dimensional hybrid pixel array detector configured to detect radiation rays, comprising:
   a plurality of pixels;
   a detection unit configured to detect the radiation rays incident in a region of a pixel of the plurality of pixels; and
   a plurality of readout chips including counting circuits respectively connected to each of the plurality of pixels only with bump bondings, wherein
   the counting circuits have a smaller set pitch than a set pitch of the plurality of pixels along a certain direction in a detection surface, the set pitch being the arrangement interval between the centers of the counting circuits or the pixels,
   a shape of the pixel between facing edges of the plurality of readout chips is identical to a shape of the pixel in a central region of the plurality of readout chips, and
   with regard to all of the plurality of pixels and all of the counting circuits, a region occupied by a specific pixel of the plurality of pixels at least partially overlaps a region occupied by a counting circuit, and the specific pixel and the counting circuit are connected by a bump bonding only in a region where the specific pixel and the counting circuit overlap.

2. The detector according to claim 1, wherein a distance between edges of adjacent ones of the readout chips is 30 µm or more.

3. The detector according to claim 1, wherein connection positions of the plurality of pixels and the counting circuits of the readout chips are distributed in a linearly symmetric or point symmetric manner.

4. The detector according to claim 1 wherein, the shape of each of the plurality of pixels is rectangular.

5. The detector according to claim 1 wherein, the connection from the counting circuit to a terminal has a via structure.

6. The detector according to claim 1 wherein, the counting circuit closest to the facing edges of the plurality of readout chips is electrically connected to the plurality of pixels at a position biased toward the facing edges.

* * * * *